United States Patent [19]

Spence

[11] 4,048,632
[45] Sept. 13, 1977

[54] DRIVE CIRCUIT FOR A DISPLAY
[75] Inventor: John R. Spence, Villa Park, Calif.
[73] Assignee: Rockwell International Corporation, El Segundo, Calif.
[21] Appl. No.: 664,222
[22] Filed: Mar. 5, 1976
[51] Int. Cl.² .......................................... H01L 27/15
[52] U.S. Cl. .............................. 340/324 R; 307/251; 307/270; 340/336; 307/296 A
[58] Field of Search ..................... 307/251, 270, 296; 340/336, 324 M, 324 R

[56] References Cited
U.S. PATENT DOCUMENTS

| | | | |
|---|---|---|---|
| 3,631,267 | 12/1971 | Heimbigner | 307/251 |
| 3,660,684 | 5/1972 | Padgett et al. | 307/270 |
| 3,806,738 | 4/1974 | Chin et al. | 307/251 |
| 3,808,468 | 4/1974 | Ludlow et al. | 307/251 |
| 3,925,690 | 12/1975 | Spence | 340/324 M |
| 3,946,245 | 3/1976 | McClaughry | 307/251 |
| 3,947,840 | 3/1976 | Craford et al. | 340/324 M |
| 3,988,617 | 10/1976 | Price | 307/270 |
| Re. 27,305 | 3/1972 | Polkinghorn et al. | 307/251 |

Primary Examiner—David L. Trafton
Attorney, Agent, or Firm—H. Fredrick Hamann; G. Donald Weber, Jr.; Morland Charles Fischer

[57] ABSTRACT

A compact circuit for selectively controlling the operation of a plurality of metal oxide semiconductor field effect transistors (MOSFETs) which drive a readout display, such as that found in a hand-held calculator, or the like. The circuit includes an internal power supply to develop a driving voltage ($V_{gg}$), the magnitude of which is substantially boosted with respect to that of the calculator operating voltage ($V_{DD}$). The circuit also includes an improved strobe driver connected between the display and the power supply to selectively apply the boosted driving voltage to a control electrode of any one of the plurality of MOSFETs.

14 Claims, 3 Drawing Figures 4,048,632

DRIVE CIRCUIT FOR A DISPLAY

BACKGROUND OF THE INVENTION

1. Field of the Invention

This invention relates to a compact circuit to selectively drive any one of a plurality of transistor devices which control the operation of a display, such as a light emittting diode display found in a handheld calculator, or the like.

2. Prior Art

A conventional readout display, such as a light emitting diode display found in hand-held calculators, or the like, in frequently powered by a 9 volt battery. However, the available energy which can be supplied from the battery typically diminishes (i.e. to 6 volts) with the continued passage of time and battery use. As a result, the display is undesirably dimmed.

It is customary, in the prior art, to include an additional external power supply to insure that suitable power is available to adequately energize the display. This results in the undesirable effects of increased calculator cost and size.

SUMMARY OF THE INVENTION

Briefly, and in general terms, a compact circuit is disclosed for controlling the operation of a utilization device, such as, for example, a light emitting diode display found in a hand-held calculator, or the like. The circuit is comprised of an internal power supply and an improved strobe driver.

The internal power supply is formed on a semiconductor chip or chips. The power supply includes means to substantially boost the voltage of the chip operating supply (e.g. a 9 volt battery) without the requirement of an external power supply, common to prior art driver circuits. The power supply is arranged to boost the voltage of the chip operating supply without being subject to the undesirable effects of threshold level voltage drops caused by the inherent impedances of semiconductor devices which comprise the instant power supply. The improved strobe driver supplies the boosted voltage, as developed by the power supply, to selectively enable any one of a plurality of strobe driver transistors. In a preferred embodiment, the strobe driver transistors are enabled in order to drive respective symbols comprising an associated display.

DESCRIPTION OF THE PREFERRED EMBODIMENT

Figure 1:
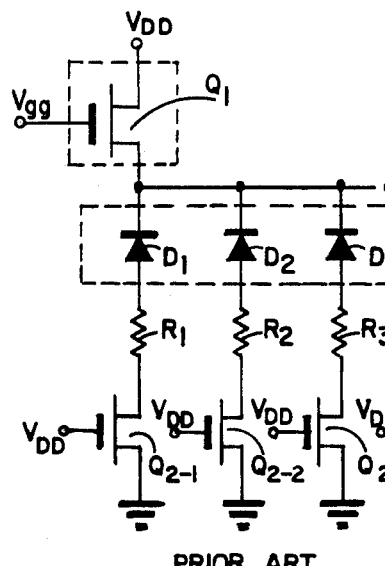
FIG. 1 shows an example of a prior art circuit for driving a light emitting diode display.

Referring to the prior art FIG. 1, a conventional display 1, comprised of suitable light emitting diodes (LEDs) $D_1 - D_n$, is illustrated. Such a LED display 1 can be utilized in arithmetical calculators, and the like, such as that which may be held by hand. The operation of one such display is described in U.S. Pat. No. 3,925,690 issued Dec. 9, 1975. A conventional way of driving the light emitting diodes $D_1 - D_n$ from a metal oxide semiconductor (MOS) chip or chips includes the utilization of a strobe driver or digit select field effect transistor (FET) $Q_1$ for driving each digit or symbol of display to be illuminated. For convenience, only one symbol of display and corresponding strobe driver transistor are illustrated. One of a plurality of segment select field effect transistors (FETs) $Q_{2-1} - Q_{2-n}$ is connected in series with a respective current limiting resistor $R_1 - R_n$, a light emitting diode $D_1 - D_n$, and a source of reference potential (e.g. ground). A control or gate electrode of each of the segment select FETs $Q_{2-1} - Q_{2-n}$ is connected to the chip operating voltage supply, designated $V_{DD}$, such as, for example, a 9 volt battery, through suitable driver circuitry (not shown). One conduction path electrode of strobe driver FET $Q_1$ is connected at a common electrical junction with the cathode electrodes of LEDs $D_1 - D_n$. The second conduction path electrode of FET $Q_1$ is connected to the chip operating voltage supply $V_{DD}$.

In order to provide adequate drive potential to selectively operate strobe driver FET $Q_1$, the control or gate electrode thereof must be connected to receive a signal, designated $V_{gg}$, which is greater (i.e. more negative) than the signal (i.e. the chip operating $V_{DD}$) applied to the second conduction path electrode thereof. For example, signal $V_{gg}$ may conveniently be twice the chip operating supply voltage (e.g. $-18$ volts). Conventional circuits undesirably include an additional external power supply to provide a voltage $V_{gg}$ having sufficient magnitude to suitably drive the digit select FETs (e.g. $Q_1$) to thereby provide a bright readout of the display 1.

Figure 3:
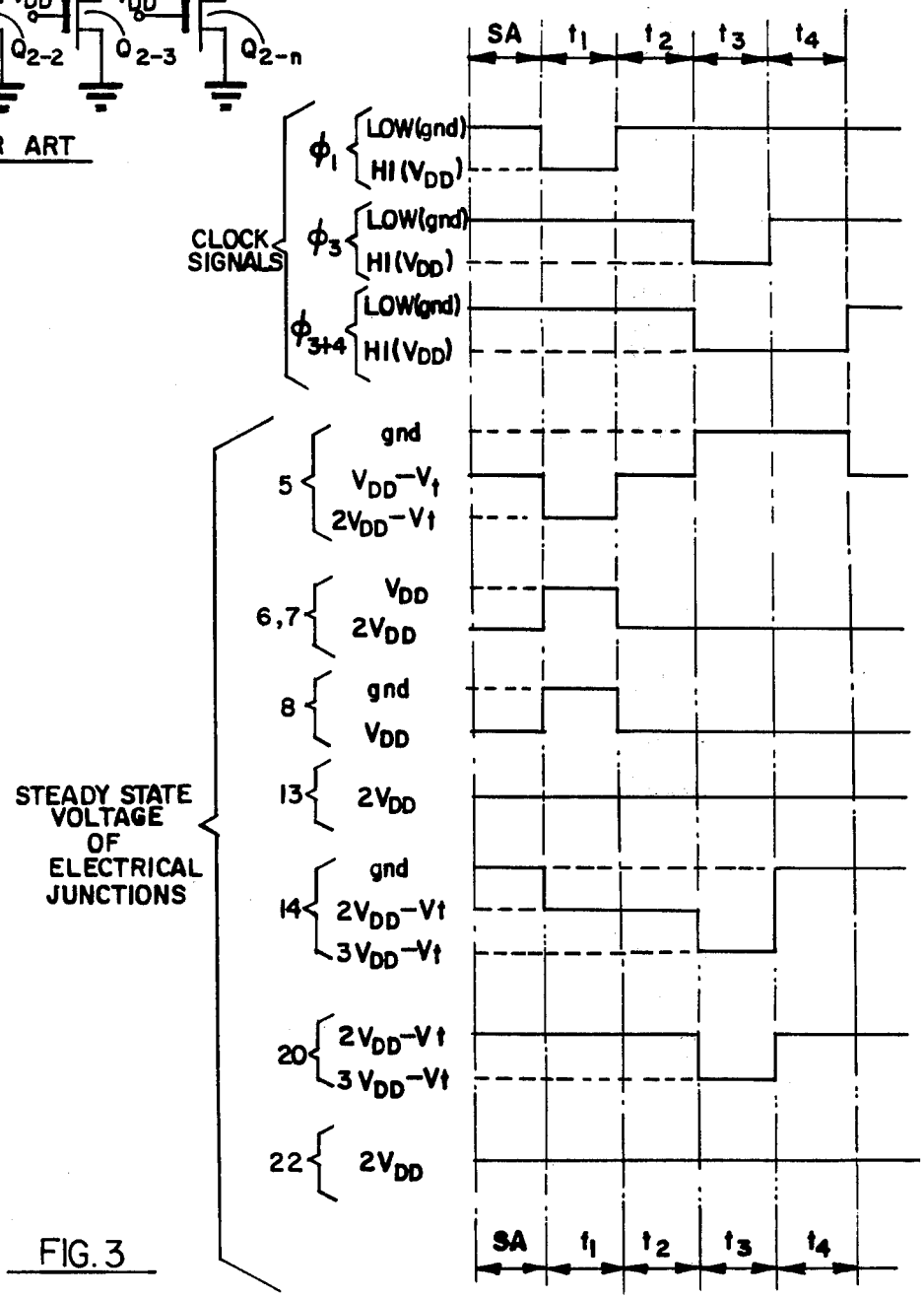
FIG. 3 shows waveforms representative of multiphase clock control signals and the steady state voltages of electrical junctions comprising the circuit of FIG. 2 relative to different intervals of time.
Figure 2:
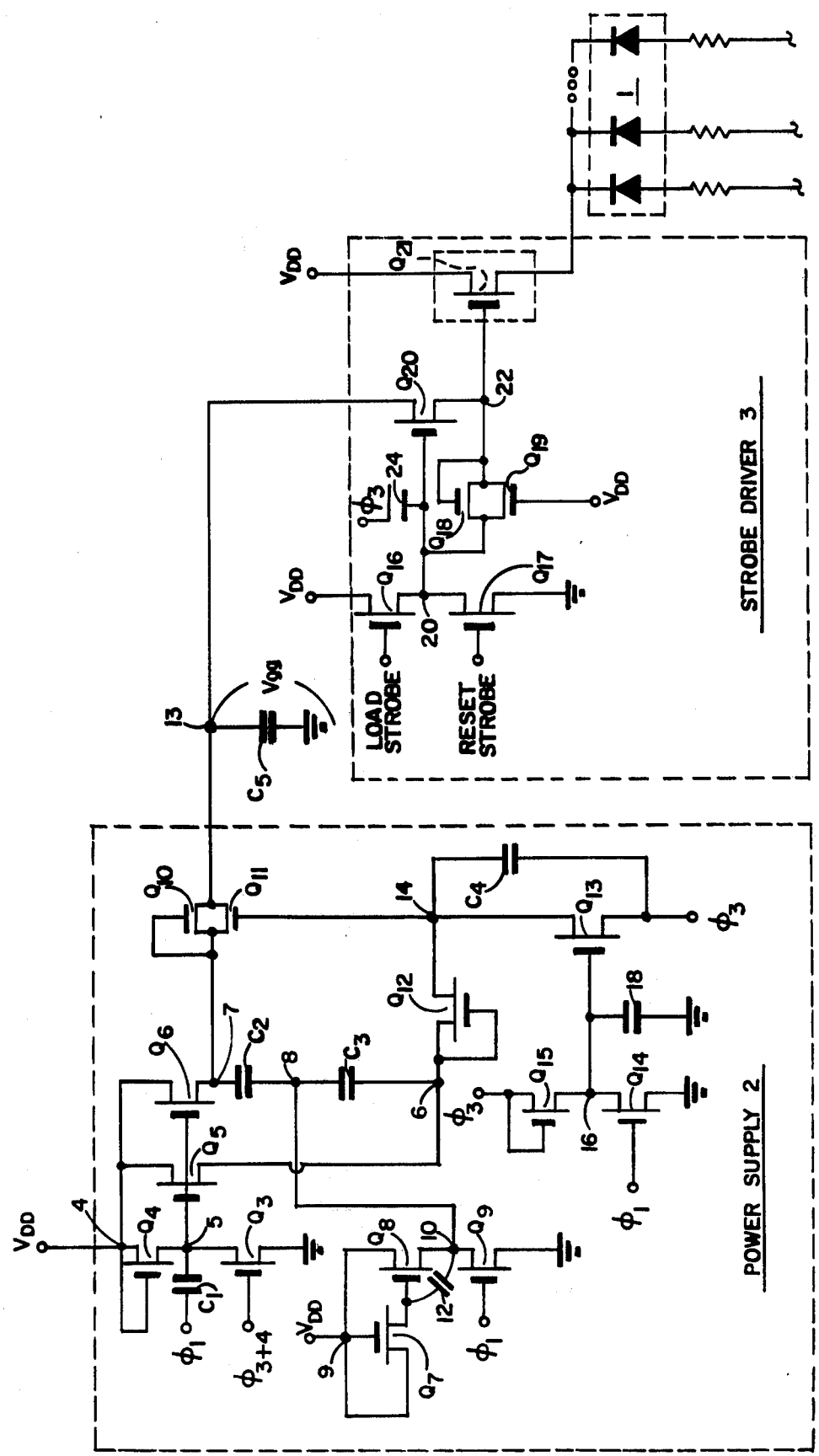
FIG. 2 shows the driver circuit of the instant invention for operating, in one embodiment, a light emitting diode display.

FIG. 2 shows a compact circuit to produce a suitably boosted voltage signal, $V_{gg}$, derived from the chip operating voltage supply, $V_{DD}$, to drive a strobe driver transistor and, thereby, operate an LED display without the size or expense of an additional external power supply common to prior art circuits. In accordance with the instant invention, the unique circuit includes an internal power supply 2 and an improved strobe driver 3. The power supply 2 and strobe driver 3 can be disposed with the calculator logic and control circuitry on a semiconductor chip or chips. The instant circuit is synchronously controlled by suitable clock means, such as, for example, a multiphase clock signal generator (not shown). The waveforms of multiphase clock signals supplied by the clock signal generator are illustrated in FIG. 3. The multiphase clock signals provide relatively HI and LOW level signals, corresponding to $V_{DD}$ and ground, respectively.

The power supply 2 includes a first inverter comprised of FETs $Q_3$ and $Q_4$. One conduction path electrode of FET $Q_3$ is connected to a source of reference potential, such as ground. One conduction path electrode and the gate electrode of FET $Q_4$ are connected together at a common electrical junction 4 with the chip operating voltage supply $V_{DD}$. The second conduction path electrodes of FETs $Q_3$ and $Q_4$ are connected together at a common electrical junction 5 with one plate of a storage capacitor $C_1$. The second plate of storage capacitor $C_1$ is connected to a clock terminal means so as to receive a clock signal, designated $\phi_1$. The control or gate electrode of FET $Q_3$ is connected to a clock terminal means so as to receive a clock signal, designated $\phi_{3+4}$.

Common electrical junction 5 is connected to the gate electrodes of a pair of FETs $Q_5$ and $Q_6$. One of the conduction path electrodes of each of FETs $Q_5$ and $Q_6$ is connected to the common electrical junction 4 with the chip operating voltage supply $V_{DD}$. The second conduction path electrode of FET $Q_5$ is connected at a common electrical junction 6 with one plate of a storage capacitor $C_3$. The second conduction path electrode of FET $Q_6$ is connected at a common electrical junction 7 with one plate of a storage capacitor $C_2$. The second plates of storage capacitors $C_2$ and $C_3$ are connected together at a common electrical junction 8.

Power supply 2 also includes a bootstrap-inverter circuit comprised of FETs $Q_7$ - $Q_9$ and feedback capacitor 12. One conduction path electrode of FET $Q_7$ is connected to the gate electrode of FET $Q_8$. The second conduction path electrode and the gate electrode of FET $Q_7$ and one conduction path electrode of FET $Q_8$ are connected together at a common electrical junction 9 with the chip operating voltage supply $V_{DD}$. The second conduction path electrode of FET $Q_8$ is connected at a common electrical junction 10 (i.e. electrically corresponding to common electrical junction 8) with one plate of capacitor 12. The second plate of capacitor 12 is connected to a point between the first electrode of FET $Q_7$ and the gate electrode of FET $Q_8$. Common electrical junction 10 (as well as common electrical junction 8) is connected to a point between the second plates of storage capacitors $C_2$ and $C_3$. A first conduction path electrode of inverter FET $Q_9$ is connected to the second conduction path electrode of FET $Q_8$ at the common electrical junction 10. The second conduction path electrode of FET $Q_9$ is connected to a source of reference potential, such as ground. The gate electrode of FET $Q_9$ is connected to a clock terminal means so as to receive a clock signal, designated $\phi_1$.

One conduction path electrode and the gate electrode of a FET $Q_{10}$ and one conduction path electrode of a FET $Q_{11}$ are connected together at common electrical junction 7. The second conduction path electrodes of FETs $Q_{10}$ and $Q_{11}$ are connected together at another common electrical junction 13, so that the conduction paths of FETs $Q_{10}$ and $Q_{11}$ are electrically connected in parallel with respect to one another.

One conduction path electrode and the gate electrode of a FET $Q_{12}$ are connected together at common electrical junction 6. The second conduction path electrode of FET $Q_{12}$ is connected at a common electrical junction 14 with the gate electrode of FET $Q_{11}$. One conduction path electrode of a FET $Q_{13}$ and one plate of a storage capacitor $C_4$ are also connected together at common electrical junction 14. The second plate of storage capacitor $C_4$ is connected to the second conduction path electrode of FET $Q_{13}$, and capacitor $C_4$ is, thereby, connected across the conduction path of FET $Q_{13}$. The second conduction path electrode of FET $Q_{13}$ is connected to a clock terminal means to receive a clock signal, designated $\phi_3$.

Power supply 2 includes another inverter comprised of FETs $Q_{14}$ and $Q_{15}$. One conduction path electrode of FET $Q_{14}$ is connected to a source of reference potential, such as ground. The gate electrode of FET $Q_{14}$ is connected to a clock terminal means to receive a clock signal, designated $\phi_1$. A first conduction path electrode and the gate electrode of FET $Q_{15}$ are connected together and to a clock terminal means so as to receive a clock signal, designated $\phi_3$. The second conduction path electrodes of FETs $Q_{14}$ and $Q_{15}$ are connected together at a common electrical junction 16. Common electrical junction 16 is connected to the gate electrode of FET $Q_{13}$. A capacitor 18 is connected between common electrical junction 16 and a source of reference potential, such as ground.

One plate of an interface storage capacitor $C_5$ is connected between power supply 2 and the improved strobe driver 3 at the common electrical junction 13 formed between the second conduction path electrodes of FETs $Q_{10}$ and $Q_{11}$. The second plate of storage capacitor $C_5$ is connected to a source of reference potential, such as ground.

One example of a previously disclosed strobe driver which may also comprise a portion of the strobe driver 3 of the instant invention can be found in U.S. Pat. No. 3,798,616, issued Mar. 19, 1974, which is incorporated by reference. Briefly, the prior art strobe driver includes a pair of control transistors (e.g. FETs $Q_{16}$ and $Q_{17}$). One conduction path electrode of FET $Q_{16}$ is connected to receive the chip operating voltage $V_{DD}$. One conduction path electrode of FET $Q_{17}$ is connected to a source of reference potential, such as ground. The second conduction path electrodes of FETs $Q_{16}$ and $Q_{17}$ are connected together at a common electrical junction 20. The gate electrode of FET $Q_{16}$ is connected to terminal means to control the energization of the strobe driver. The gate electrode of FET $Q_{17}$ is connected to terminal means to reset the strobe driver. The operation of FETs $Q_{16}$ and $Q_{17}$ is controlled by logic circuitry (not shown) in order to selectively activate or deactivate any one of a plurality of strobe driver transistors in a multi-symbol display.

In accordance with the improved strobe driver 3 of the instant invention, one conduction path electrode of each of a pair of FETs $Q_{18}$ and $Q_{19}$ is connected together at the common electrical junction 20 formed at the connection of the second conduction path electrodes of FETs $Q_{16}$ and $Q_{17}$. The gate electrode of FET $Q_{18}$ and the second conduction path electrodes of FETs $Q_{18}$ and $Q_{19}$ are connected together at a common electrical junction 22, so that the conduction paths of FETs $Q_{18}$ and $Q_{19}$ are electrically connected in parallel with respect to one another. The gate electrode of FET $Q_{19}$ is connected to receive the chip operating voltage, $V_{DD}$.

The first and second conduction path electrodes of a FET $Q_{20}$ are respectively connected between common electrical junctions 13 and 22. The gate electrode of FET $Q_{20}$ is connected to common electrical junction 20. One plate of a voltage variable capacitor 24, formed from the gate of a MOSFET device, is connected to the first conduction path electrodes of FETs $Q_{18}$ and $Q_{19}$ and to the gate electrode of FET $Q_{20}$ at common electrical junction 20. The second plate of capacitor 24 is connected to a clock terminal means to receive a clock signal designated $\phi_3$.

The gate electrode of a strobe driver FET $Q_{21}$ is connected to the common electrical junction 22 formed between the gate electrode of FET $Q_{18}$ and the second conduction path electrodes of FETs $Q_{18}$ - $Q_{20}$. Strobe driver FET $Q_{21}$ of the improved strobe driver 3 corresponds to the strobe driver transistor (e.g. FET $Q_1$ of FIG. 1) utilized in prior art display circuits. Thus, the first conduction path electrode of FET $Q_{21}$ is connected to receive the chip operating voltage $V_{DD}$, and the second conduction path electrode of FET $Q_{21}$ is connected at a common electrical junction with the cathodes of each of the light emitting diodes comprising display 1. However, it is to be understood that the instant circuit is also suitable to drive other displays (e.g. liquid crystal display, fluorescent tube display, etc.)

In operation, and referring concurrently to FIGS. 2 and 3, during an interval of time designated SA, commonly referred to as an in-between clock interval, the clock generator applies relatively LOW level signals $\phi_{3+4}$ and $\phi_1$, to the gate electrode of inverter FET $Q_3$ and to the second plate of storage capacitor $C_1$, respectively. Thus, FET $Q_3$ is rendered non-conductive. Inverter FET $Q_4$ is rendered conductive, inasmuch as the gate electrode thereof is connected directly to the chip operating voltage supply $V_{DD}$ at common electrical junction 4. Common electrical junction 5 and storage capacitor $C_1$ are, thereby, charged via the conduction path of FET $Q_4$, to a voltage equivalent to the chip operating voltage minus a threshold level drop of FET $Q_4$ (i.e. $V_{DD} - V_t$).

During an interval of time designated $t_1$, the clock generator supplies a relatively LOW level signal, $\phi_{3+4}$, to the gate electrode of FET $Q_3$ and a relatively HI level signal, $\phi_1$, to the second plate of storage capacitor $C_1$. Thus, during the $t_1$ time interval, the voltage across storage capacitor $C_1$, as well as that applied to electrical junction 5 is raised an additional $V_{DD}$ from $V_{DD} - V_t$ to a boosted voltage equivalent to $2V_{DD} - V_t$. FET $Q_4$ is rendered non-conductive, inasmuch as the voltage applied to electrical junction 5 is substantially more negative than that applied to electrical junction 4 (and to the gate electrode of FET $Q_4$).

Also during the $t_1$ time interval, FETs $Q_5$ and $Q_6$ are rendered conductive, inasmuch as each of the gate electrodes thereof is connected to common electrical junction 5 to receive the boosted voltage signal applied thereto. Moreover, a relatively HI level clock signal $\phi_1$, is applied to the gate electrode of FET $Q_{14}$, and FET $Q_{14}$ is rendered conductive. FET $Q_{13}$ is rendered non-conductive, inasmuch as the gate electrode is clamped to ground during the $t_1$ time interval via common electrical junction 16 and the conduction path of FET $Q_{14}$. Inactivating FET $Q_{13}$ prevents the conduction of d.c. current from common electrical junction 4 to ground through a current path comprising the respective conduction paths of FETs $Q_5$, $Q_{12}$, and $Q_{13}$. Inverter FET $Q_9$ is also rendered conductive during the $t_1$ time interval, inasmuch as a relatively HI level clock signal, $\phi_1$, is applied to the gate electrode thereof. Therefore, common electrical junction 8, as well as common electrical junction 10, is clamped to ground through the conduction path of FET $Q_9$. The first plate of storage capacitor $C_2$ is connected to the chip operating voltage supply $V_{DD}$ at common electrical junction 4 via the conduction path of FET $Q_6$. The first plate of storage capacitor $C_3$ is connected to the chip operating voltage supply $V_{DD}$ at common electrical junction 4 via common electrical junction 6 and the conduction path of FET $Q_5$. Thus, during the $t_1$ time interval, each of the storage capacitors $C_2$ and $C_3$ are precharged to a voltage equivalent to the chip operating voltage $V_{DD}$ (inasmuch as the voltage $2V_{DD} - V_t$, applied to electrical junction 5 is substantially more negative than that, $V_{DD}$, applied to electrical junction 4).

During an interval of time designated $t_2$, the clock generator supplies relatively LOW level signals, $\phi_{3+4}$ and $\phi_1$, to the gate electrode of FET $Q_3$ and to the second plate of storage capacitor $C_1$, respectively. FETs $Q_5$ and $Q_6$ are rendered non-conductive, inasmuch as each of the gate electrodes, connected to common electrical junction 5, receive a voltage $(V_{DD} - V_s)$ which is less negative than the voltage applied to each of the conduction path electrodes thereof. Likewise, during the $t_2$ time interval, the clock generator supplies a relatively LOW level signal, $\phi_1$, to the gate electrode of FET $Q_9$, and FET $Q_9$ is rendered non-conductive.

Meanwhile, during the $t_2$ time interval, the bootstrap-inverter circuit comprised of capacitor 12 and FETs $Q_7 - Q_9$ charges common electrical junction 10 to a voltage equivalent to the chip operating voltage $V_{DD}$. The operation of such a bootstrap-inverter circuit is described, in detail, in U.S. Pat. No. RE 2,305, issued Mar. 14, 1972, which is incorporated by reference. Briefly, however, FET $Q_7$ is rendered conductive, inasmuch as the gate electrode thereof is connected directly to the chip operating voltage supply $V_{DD}$. The gate electrode of FET $Q_8$ is also connected to receive the chip operating voltage via the conduction path of FET $Q_7$, and FET $Q_8$ is, thereby, rendered conductive. Inasmuch as FET $Q_9$ is rendered non-conductive, as described above, the chip operating voltage, $V_{DD}$, is applied to common electrical junction 10 (and to common electrical junction 8) via the conduction path of FET $Q_8$. Capacitors $C_2$ and $C_3$ have previously been charged to $V_{DD}$ during time interval $t_1$. As is well known, the capacitors will not discharge immediately. In addition, no discharge path is provided. Therefore, when junction 8 assumes the voltage level $V_{DD}$ during the $t_2$ time interval, the cumulative voltage applied to each electrical junction 6 and 7 (i.e. as respectively supplied via the conduction paths of FETs $Q_5$ and $Q_6$ and from the common electrical connection of junctions 10 and 8) is boosted to a level equivalent to twice the chip operating voltage (i.e. $2V_{DD}$).

FETs $Q_{10}$ and $Q_{12}$ are rendered conductive, inasmuch as the gate electrodes thereof are connected directly to common electrical junctions 7 and 6, respectively. Thus, common electrical junction 7 is connected to common electrical junction 13 via the conduction path of FET $Q_{10}$, and common electrical junction 6 is connected to common electrical junction 14 via the conduction path of FET $Q_{12}$. FET $Q_{11}$ is also rendered conductive, inasmuch as the gate electrode thereof is connected to common electrical junction 6 via common electrical junction 14 and the conduction path of FET $Q_{12}$. Thus, common electrical junction 13 is precharged to a voltage equivalent to the voltage at common electrical junction 7 minus a threshold level drop of FET $Q_{10}$ (i.e. $2V_{DD} - V_s$), and the voltage at common electrical junction 14 is equivalent to the voltage at common electrical junction 6 minus a threshold level drop of FET $Q_{12}$ (i.e. also $2V_{DD} - V_s$).

To eliminate the threshold level drop, $V_t$, in voltage (i.e. approximately $-1.5$ volts) at electrical junction 13 caused by the presence of FET $Q_{10}$, the clock generator supplies relatively HI level signals, $\phi_3$, to the second plate of storage capacitor $C_4$, to the second conduction path electrode of FET $Q_{13}$, and to the gate and first conduction path electrodes of FET $Q_{15}$ during an interval of time designated $t_3$. FET $Q_{15}$ is thereby, rendered conductive, and capacitor 18 is subsequently charged to a voltage equivalent to the chip operating voltage minus a threshold level drop of FET $Q_{15}$ (i.e. $V_{DD} - V_t$). FET $Q_{13}$ is rendered non-conducting during the $t_3$ time interval, inasmuch as the gate electrode, connected to electrical junction 16, receives a signal, the voltage of which $(V_{DD} - V_t)$ is less negative than the voltage applied to either of the conduction path electrodes thereof. Also during the $t_3$ time interval, a relatively LOW level signal is applied to the gate electrode of FET $Q_{14}$, and FET $Q_{14}$ is disabled. Hence, during the $t_3$ clock interval, the voltage applied to common electrical junction 14, and subsequently stored on storage capacitor $C_4$, is boosted an additional amount from $2V_{DD} - V_t$ to a cumulative voltage of $3V_{DD} - V_t$ by the HI level signal (i.g. $V_{DD}$) applied to electrical junction 14 via storage capacitor $C_4$. As a result thereof, FET $Q_{11}$ is turned on hard. That is, the voltage, $3V_{DD} - V_t$, applied from common electrical junction 14 to the gate electrode of FET $Q_{11}$ (approximately $-25.5$ volts) is substantially more negative than the voltages applied to either of the conduction path electrodes of FET $Q_{11}$ connected to common electrical junctions 7 and 13 (approximately $-18$ volts and $-16.5$ volts, respectively). The impedance of FET $Q_{11}$ is, thereby, reduced and the threshold level drop, $V_t$, across the conduction path electrodes thereof is substantially eliminated.

Also during the $t_3$ clock interval, FET $Q_{10}$ is cut-off, inasmuch as insufficient threshold potential is available between the gate electrode and either of the conduction path electrodes thereof, respectively connected to electrical junctions 7 and 13. Therefore, common electrical junction 13 and interface storage capacitor $C_5$ are subsequently charged via the conduction path of FET $Q_{11}$, during the $t_3$ clock interval, by a signal $V_{gg}$, the voltage of which, $2V_{DD}$, is equivalent to twice the chip operating voltage. Moreover, the chip operating voltage is boosted without being otherwise subject to an undesirable threshold level drop (of FET $Q_{10}$). Thus, in a preferred embodiment, power supply 2 comprises a voltage doubler.

In order to maintain the boosted signal (i.e. $2V_{DD}$) at common electrical junction 13 to drive a display 1, a relatively LOW level signal is applied to common electrical junction 14 at the end of the $t_3$ time interval. During an interval of time designated $t_4$, the clock signal generator applies a relatively LOW level signal, $\phi_3$ to the second conduction path electrode of FET $Q_{13}$ and to the gate and first conduction path electrodes of FET $Q_{15}$. FET $Q_{15}$ is rendered non-conductive, and FET $Q_{13}$ is subsequently enabled, inasmuch as capacitor 18, which is charged during the $t_3$ interval and is connected to the gate electrode of FET $Q_{13}$, maintains its charge during the $t_4$ time interval. Thus, the gate electrode of FET $Q_{11}$ is clamped to ground through common electrical junction 14 and the conduction path of FET $Q_{13}$. Consequently, during the $t_4$ time interval, both FETs $Q_{10}$ and $Q_{11}$ are cut-off, and common electrical junction 13 is disconnected from common electrical junction 7. Thus, at the end of the $t_4$ time interval, the signal $V_{gg}$ ($2V_{DD}$), developed by interval power supply 3 and applied across interface storage capacitor $C_5$, is of suitable magnitude to drive any one of the strobe driver transistors (e.g. FET $Q_{21}$) so as to insure a bright readout of LED display 1 without using an additional external power supply common to conventional drive circuits.

During both the $t_4$ time interval and the following SA time interval of a succeeding clock signal, the voltage of common electrical junction 7 is maintained at $2V_{DD}$ (i.e. by means of the voltage stored on storage capacitor $C_2$ and the signal supplied from electrical junction 9). However, during the next succeeding $t_1$ time interval, the voltage at common electrical junction 7 drops from $2V_{DD}$ to $V_{DD}$, inasmuch as FET $Q_9$ is rendered conductive during the $t_1$ time interval, as previously disclosed. Common electrical junction 8 (as well as common electrical junction 10) is clamped to ground via the conduction path of FET $Q_9$. After the next clock cycle, the voltage at common electrical junction 7, which may be leaked or transferred to common electrical junction 13 via the conduction paths of FETs $Q_{10}$ and $Q_{11}$, is replenished to $V_{DD}$.

With a suitable signal, $V_{gg}$ (i.e. $2V_{DD}$), stored across interface capacitor $C_5$, common electrical junction 13 can be selectively connected to the gate electrode of any of the transistors (e.g. FET $Q_{21}$) comprising the improved strobe driver 3. Thus, any of the symbols forming LED display 1 may be operated by a respective strobe driver transistor to provide a bright readout, even if the chip operating voltage, $V_{DD}$, diminishes (e.g. from 9 to 6 volts). The operation of that portion of strobe driver 3 which has been previously disclosed is described in the aforementioned U.S. Pat. No. 3,798,616, issued Mar. 19, 1974, and incorporated by reference, above. Therefore, the operation of strobe driver 3 will be detailed only with respect to the improved portion thereof.

To selectively activate any of the plurality of strobe driver transistors, such as, for example, FET $Q_{21}$, suitable logic control circuitry (not shown) applies a relatively HI level signal to the gate electrode of FET $Q_{16}$ for the duration of one time interval (e.g. $t_2$). FET $Q_{16}$ is, thereby, rendered conductive, and capacitor 24 is subsequently charged to a voltage of $V_{DD}$ minus a threshold level drop of FET $Q_{16}$. At the same time the logic control circuitry applies a relatively LOW level signal to the gate electrode of FET $Q_{17}$, and FET $Q_{17}$ is rendered non-conductive. During the $t_3$ time interval, the clock generator applies a relatively HI level signal, $\phi_3$, to charge voltage variable capacitor 124. The gate electrode of FET $Q_{20}$ is connected to one plate of voltage variable capacitor 24 and to the chip operating voltage supply, $V_{DD}$, via common electrical junction 20 and the conduction path of FET $Q_{16}$. The gate electrode of FET $Q_{20}$, thereby, receives a cumulative negative voltage (i.e. comprising those voltages stored by capacitor 24 during the $t_2$ interval and supplied to capacitor 24 by the clock signal generator during the $t_3$ interval) equivalent to $2V_{DD}$ minus a threshold level drop, $V_t$, of FET $Q_{16}$. Hence, FET $Q_{20}$ is rendered conductive during the $t_3$ clock interval. As a result, common electrical junction 22 is charged to a voltage equivalent to $2V_{DD} - 2V_t$ (i.e. one threshold level drop in the voltage, $2V_{DD} - V_t$, applied to the gate electrode of FET $Q_{20}$).

During the $t_4$ time interval, when common electrical junctions 7 and 13 are disconnected from one another, common electrical junction 22 is connected to common electrical junction 20 through the conduction path of FET $Q_{18}$. FET $Q_{18}$ is rendered conductive by the voltage ($2V_{DD} - 2V_t$) applied directly to the gate electrode thereof from electrical junction 22. Thus, during the first full cycle, the voltage applied to common electrical junction 20 ($2V_{DD} - 3V_t$) is equivalent to the voltage at common electrical junction 22 minus a threshold level drop of FET $Q_{18}$. The voltage ($-13.5$ volts) applied to common electrical junction 20 ($2V_{DD} - 3V_5$) during the $t_4$ time interval is substantially more negative than the initial voltage ($-7.5$ volts) applied to junction 20 ($V_{DD} - V_t$) during the $t_2$ time interval, and, therefore, a voltage regenerative effect is established via a feedback path from electrical junction 22 to electrical junction 20 (and the gate electrode of FET $Q_{20}$) through the conduction path of FET $Q_{18}$.

After the next clock cycle, common electrical junction 20 is supplied with a steady state voltage equivalent to $3V_{DD} - V_t$ (i.e. $2V_{DD} - V_t$ stored by capacitor 24 after the first full clock cycle plus an additional boost in voltage of $V_{DD}$ supplied via capacitor 24 and the clock signal generator during the $t_3$ time interval of the next clock cycle). The voltage at electrical junction 20, approximately −25.5 volts, is substantially more negative than the voltages (i.e. $2V_{DD}$ and $2V_{DD} - 2V_t$) applied to either of the first and second conduction path electrodes of FET $Q_{20}$ from electrical junction 13, approximately −18 volts, and 22, approximately −15 volts, respectively, and FET $Q_{20}$ is turned on hard. Therefore, at steady state operating conditions, the voltage (i.e. $2V_{DD}$) stored on interface capacitor $C_5$ is supplied from common electrical junction 13 to common electrical junction 22 via the conduction path of FET $Q_{20}$ without being subject to the undesirable threshold level drop of FET $Q_{20}$. The negative signal, equivalent to $2V_{DD}$ and applied from common electrical junction 22 to the gate electrode of digit select FET $Q_{21}$, is of sufficient magnitude to provide the threshold potential required to drive FET $Q_{21}$. Therefore, the cathode electrodes of the light emitting diodes comprising one symbol of display 1 are connected together and to the chip operating voltage supply, $V_{DD}$, via the conduction path of FET $Q_{21}$.

Power supply 2 and strobe driver 3 are arranged in a compact circuit (e.g. on a calculator semiconductor chip or chips) to provide a bright readout for display 1 without the use of an external power supply, common to prior art display circuits, or without being subject to the undesirable effects of threshold level drops in voltage caused by certain ones of those transistor devices comprising power supply 2 and strobe driver 3.

It will be apparent that while a preferred embodiment of the invention has been shown and described, various modifications and changes may be made without departing from the true spirit and scope of the invention. For example, although, in a preferred embodiment, the boosted voltage, $2V_{DD}$, developed by power supply 2 to drive the strobe driver transistors, is twice that of the chip operating voltage, $V_{DD}$, it is to be understood that the particular magnitude of the boosted voltage is chosen for convenience only. It has been found that by developing a boosted drive voltage which is a multiple of the chip operating voltage, (i.e. $2V_{DD}$, $3V_{DD}$,...), undesirable circuit parameters and variations in display light intensity are avoided. However, as will be recognized by those skilled in the art, a sufficiently boosted voltage (e.g. $2V_{DD} - V_t$) other than that which is equivalent to a multiple of the chip operating voltage can be developed to drive a strobe driver field effect transistor.

Having thus set forth a preferred embodiment of the instant invention, what is claimed is:

1. In combination:
at least one first multi-terminal semiconductor device,
source means to supply a reference potential signal,
power supply means connected to said source for boosting said reference potential signal, and
driver means connected between said power supply means and said at least one semiconductor device and adapted to selectively apply said boosted signal to a control electrode of said first semiconductor device to thereby drive said device,
said driver means including second and third multiterminal semiconductor devices,
the conduction path of said second semiconductor device selectively connected between said power supply means and the control electrode of said at least one first semiconductor device,
the conduction path of said third semiconductor device connected between one conduction path electrode and the control electrode of said second semiconductor device so as to form a feedback path therebetween, and
the control electrode of said third device connected to the one conduction path electrode of said second device.

2. The combination recited in claim 1, including display means,
said at least one first semiconductor device selectively connected between said source means and said display means in order to energize said display means.

3. The combination recited in claim 1, said driver means further including means to selectively connect said source means to the control electrode of said second semiconductor device,
the control electrode of said second semiconductor device receiving a driving signal comprising said reference potential signal and a feedback signal via the one conduction path electrode of said second device and the conduction path of said third device, said driving signal sufficient to substantially reduce the impedance of said second device.

4. The combination recited in claim 3, wherein the means to selectively connect said source means to the control electrode of said second semiconductor device includes a voltage variable capacitor.

5. The combination recited in claim 4, wherein said capacitor is connected to clock terminal means,
said clock terminal means adapted to receive a clock signal so as to supply the control electrode of said second device with said driving signal.

6. The combination recited in claim 1, including a fourth multiterminal semiconductor device connected in electrical parallel with said third semiconductor device,
first conduction path electrodes of said third and fourth semi-conductor devices connected at a common electrical junction with said one conduction path electrode of said second semiconductor device and the control electrode of said first device.

7. In combination:
at least one first multi-terminal semiconductor device,
source means to provide a first reference potential signal,
power supply means connected to said source means for boosting said first reference potential signal, and
driver means connected between said power supply means and said at least one first semiconductor device to selectively apply said boosted signal to said first semiconductor device and thereby drive said device,
said power supply means including second and third multi-terminal semiconductor devices,
the respective conduction paths of each of said second and third semiconductor devices connected in electrical parallel with respect to one another between said source means and said driver means, the control electrode of said second device connected to one conduction path electrode thereof, and
means to apply said boosted signal to the control electode of each of said second and third devices.

8. The combination recited in claim 7, wherein the means to apply said boosted signal to each of the control electrodes of said second and third semiconductor devices includes first and second capacitors,
respective first plates of said capacitors selectively connected to said source means to receive said first reference potential signal in order to charge said capacitors, and respective second plates of said capacitors connected together to selectively receive a second reference potential signal.

9. The combination recited in claim 8, including inverter means to selectively connect the respective first plates of said first and second capacitors to said source means to receive said first reference potential signal.

10. The combination recited in claim 8, including bootstrap inverter means to selectively connect the respective second plates of said first and second capacitors to said source means to receive said second reference potential signal.

11. The combination recited in claim 7, including means to provide an additional signal to said third semiconductor device control electrode so as to further boost the signal applied thereto and thereby substantially reduce the impedance of said third device with respect to that of said second device, whereby said power supply means is electrically connected to said driver means via the conduction path of said third device.

12. The combination recited in claim 11, wherein the means to provide the additional signal to said third semiconductor device control electrode includes a capacitor, said capacitor connected between said third device control electrode and clock terminal means which receives a clock signal to charge said capacitor in order to further boost the signal applied to said third device control electrode.

13. The combination recited in claim 7, wherein said first semiconductor device, said power supply means and said driver means are disposed on a single semiconductive chip.

14. A circuit for driving a semiconductor device and comprising:

reference potential source means, first and second inverter means, each of said inverter means having clock terminals to receive respective multi-phase clock signals, charge storage capacitor means, said charge storage capacitor means including first and second capacitors, transmission gate means having conduction path terminals selectively connected between one plate of said first capacitor and a control electrode of said semiconductor device to be driven, said transmission gate means having a control terminal connected to a first plate of said second capacitor, said first inverter means connecting the first plate of each of said first and second capacitors to said source means during a first of said multi-phase clock signals for charging said first and second capacitors and said transmission gate means control terminal, and said second inverter means connecting second plates of each of said first and second capacitors to said source means during a second of said multi-phase clock signals for boosting the charge of said first and second capacitors and said transmission gate means control terminal for driving said transmission gate means.

* * * * *